United States Patent
Lee et al.

(10) Patent No.: US 7,723,755 B2
(45) Date of Patent: May 25, 2010

(54) SEMICONDUCTOR HAVING BURIED WORD LINE CELL STRUCTURE AND METHOD OF FABRICATING THE SAME

(75) Inventors: Si-hyung Lee, Suwon-si (KR); Sang-ryol Yang, Hwaseong-si (KR); Myoung-bum Lee, Seoul (KR); Ki-hyun Hwang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 154 days.

(21) Appl. No.: 12/003,973

(22) Filed: Jan. 4, 2008

(65) Prior Publication Data

US 2008/0211057 A1      Sep. 4, 2008

(30) Foreign Application Priority Data

Jan. 4, 2007     (KR) ...................... 10-2007-0001185

(51) Int. Cl.
*H01L 27/00* (2006.01)
(52) U.S. Cl. ................ 257/211; 257/208; 257/E27.091
(58) Field of Classification Search ................. 257/314, 257/316, 321, 326, 330, 520, 331, 332, 211, 257/208, E27.091, E29.111
See application file for complete search history.

(56) References Cited

U.S. PATENT DOCUMENTS 5,736,455 A * 4/1998 Iyer et al. ................... 438/592
2005/0275042 A1* 12/2005 Hwang et al. ............... 257/401

FOREIGN PATENT DOCUMENTS

| JP | 2004095745 A * | 3/2004 |
|---|---|---|
| JP | 2004-158647 | 6/2004 |
| KR | 10-0273319 | 9/2000 |
| KR | 10-0614240 | 8/2006 |

* cited by examiner

*Primary Examiner*—Victor A Mandala
*Assistant Examiner*—Scott Stowe
(74) *Attorney, Agent, or Firm*—Harness, Dickey & Pierce, PLC

(57) ABSTRACT

Provided are a semiconductor device having a buried word line structure in which a gate electrode and a word line may be buried within a substrate to reduce the height of the semiconductor device and to reduce the degradation of the oxide layer caused by chlorine ions from the application of a TiN metal gate, and a method of fabricating the semiconductor device. The semiconductor device may comprise a semiconductor substrate defined by a device isolation layer and comprising an active region including a trench and one or more recess channels, a gate isolation layer on the surface of the trench, a gate electrode layer on the surface of the gate isolation layer, and a word line by which the trench may be buried on the surface of the gate electrode layer.

12 Claims, 4 Drawing Sheets

SEMICONDUCTOR HAVING BURIED WORD LINE CELL STRUCTURE AND METHOD OF FABRICATING THE SAME

PRIORITY STATEMENT

This application claims priority under 35 U.S.C. § 119 to Korean Patent Application No. 2007-0001185, filed on Jan. 4, 2007, in the Korean Intellectual Property Office (KIPO), the entire contents of which are herein incorporated by reference.

BACKGROUND

1. Field

Example embodiments relate to a semiconductor device having a buried gate electrode and a method of fabricating the same.

2. Description of Related Art

Recently, there has been increasing research on the buried word line cell array transistor (BCAT) in which a word line (WL) may be buried below the surface of a semiconductor substrate using a metal (and not a polysilicon) as a gate electrode in the structure of a conventional recess channel array transistor (RCAT). Unlike a polysilicon gate in a conventional DRAM, a word line having 0.5 F pitch/interval can be formed using a BCAT technique, and accordingly, the area of the cell can be reduced.

FIG. 1 is a cross-sectional view of a semiconductor device comprising a gate structure according to the conventional art.

Referring to FIG. 1, an active region 26 is defined in a substrate 10 by a device isolation layer 12, and a trench 14 is formed in the substrate 10. A gate insulating layer 16 is disposed on the bottom surface and the inner surface of the trench 14. A metal gate electrode 20, which fills the trench 14 on the gate insulating layer 16 and protrudes beyond the substrate 10, is formed. Spacers 24 are formed on both sides of the protruded metal gate electrode 20, and a capping pattern 22 is disposed on the upper surface of metal gate electrode 20. An active region of a source and drain is formed in the substrate adjacent to both sides of the metal gate electrode 20. The metal gate electrode 20 can serve as a gate electrode and a word line.

In the semiconductor device, the metal gate electrode 20 is buried into the substrate 10 and also protrudes beyond the surface of substrate, and accordingly, the spacer 24 for supporting the metal gate electrode 20 is required. Therefore, in the above structure, the semiconductor device having a height corresponding to the protruded portion of the metal gate electrode 20 is formed. Thus, the above structure is not ideal for embodying a thinner device.

A titanium nitride (TiN) metal gate may be formed by a chemical vapor deposition (CVD) method. In order to secure the thermal stability at a temperature above 1000° C., a resistivity of the word line below 40 kohm/line and a superior gate diode integrity (GOI) characteristic is used as the gate electrode of the BCAT. For example, in order to secure a step coverage above 10:1, a TiN layer formed by a chemical vapor deposition (CVD) method using $TiCl_4$ and $NH_3$ is used for forming the metal gate. However, chlorine ions in $TiCl_4$ are diffused into the oxide layers and silicon channels, thereby forming traps in the oxide layers. As a result, degradation characteristics of the oxidation layer occur below −3V, which is in the operation voltage region due to trap assisted tunneling (TAT). As a result, reliability of the device is reduced.

FIG. 2 is a graph illustrating gate voltage-current characteristics of the semiconductor device having a gate structure according to the conventional art.

Referring to FIG. 2, gate voltage-current characteristics of a polysilicon gate electrode according to the conventional art is denoted by Line A, and gate voltage-current characteristics of a gate electrode and a word line formed of titanium nitride (TiN) according to the conventional art as illustrated in FIG. 1 are denoted by Line B. Line B shows a higher current value as compared to Line A for a gate voltage within the range of approximately −3V to −5V, which indicates an increase of the leakage current. The degradation of the oxide layers due to the occurrence of chlorine ions from applying the TiN layer, which is formed using a CVD or an atomic layer deposition (ALD) method, is one of the causes of the problems described above.

SUMMARY

Example embodiments provide a semiconductor device having a buried word line structure in which a gate electrode and a word line may be buried inside of a substrate, thereby reducing the height of the semiconductor device and the degradation of oxide layers due to the application of a TiN metal gate. Example embodiments also provide a method of fabricating a semiconductor device having the buried word line structure as described above.

According to example embodiments, a semiconductor device having a buried word line structure may comprise a semiconductor substrate defined by a device isolation layer and comprising an active region in which a trench for forming one or more recess channels are formed. The semiconductor device having a buried word line structure may further comprise a gate insulating layer on the surface of the trench, a gate electrode layer on the surface of the gate insulating layer, and a buried word line burying the trench on the surface of the gate electrode layer.

The semiconductor device may further comprise a capping layer on the gate electrode layer and/or the buried word line. The top surface of the capping layer may be formed so as to not protrude beyond the surface of the substrate.

The trench may have a width within a range of about 10 to about 100 nm. The gate electrode layer may have a thickness within a range of about 1 to about 10 nm.

The gate electrode layer may comprise a polysilicon and the buried word line may comprise any one selected from the group consisting of titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN), or a combination thereof.

The gate electrode layer may comprise any one selected from the group consisting of titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN), or a combination thereof. The buried word line may comprise any one selected from the group consisting of tungsten (W), aluminum (Al), cupper (Cu), molybdenum (Mo), titanium (Ti), tantalum (Ta), and ruthenium (Ru), or a combination thereof. Accordingly, metals having a resistivity below about 200 μΩcm may be comprised.

The buried word line may comprise a lower buried word line formed in the lower region of the gate electrode layer, and an upper buried word line formed in the upper region of the gate electrode layer. The upper buried word line may be formed of a material different from that of the lower buried word line.

The gate electrode layer may comprise any one selected from the group consisting of titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN), or a combination thereof.

The lower buried word line may comprise polysilicon. The upper buried word line may comprise a silicide. The buried word line may comprise any one selected from the group consisting of tungsten (W), aluminum (Al), cupper (Cu), molybdenum (Mo), titanium (Ti), tantalum (Ta), and ruthenium (Ru), or a combination thereof. Accordingly, metals having a resistivity below about 200 $\mu\Omega$cm may be comprised.

The gate insulating layer may be a thermal oxide layer formed by thermal oxidation.

A method of fabricating a semiconductor device having a buried word line structure may comprise forming a device isolation layer defining an active region in a semiconductor substrate, forming a trench for forming one or more recess channels in the active region, forming a gate insulating layer on the surface of the trench, forming a gate electrode layer on the surface of the gate insulating layer, and forming a buried word line burying the trench on the surface of the gate electrode layer.

The method of fabricating a semiconductor device may further comprise forming a capping layer on the gate electrode layer and/or the buried word line. The top surface of the capping layer may be formed so as to not protrude beyond the surface of the substrate. The capping layer may be formed after forming the buried word line having the buried word line structure.

The forming of the buried word line may comprise forming a word line layer on the substrate so as to bury the trench, polishing the word line layer using chemical mechanical polishing (CMP) and an etch-back method which uses a dry etch to expose the surface of the substrate, and recessing the polished word line layer into the substrate.

The gate electrode layer may be formed using a chemical vapor deposition (CVD) or an atomic layer deposition (ALD) method. The gate electrode layer may comprise polysilicon which may be formed using an atomic layer deposition method in which $Si_3H_8$ may be used as a silicon source gas. The buried word line may be formed using a chemical vapor deposition, a physical vapor deposition (PVD), or an atomic layer deposition (ALD) method.

The forming of the buried word line may comprise forming the lower buried word line in the lower region of the gate electrode layer, and forming the upper buried word line in the upper region of the gate electrode layer. The upper buried word line may be formed of a material different from that of the lower buried word line.

The forming of the lower buried word line may comprise forming a first word line layer on the substrate so as to bury the trench, polishing the first word line layer using chemical mechanical polishing and an etch-back method which uses a dry etch to expose the surface of the substrate, and recessing the polished first word line layer into the substrate to form the lower buried word line.

The forming of the upper buried word line may comprise forming a second word line layer on the substrate so as to bury the trench in which the lower buried word line is formed, polishing the second word line layer using chemical mechanical polishing and an etch back method which uses dry etch to expose the surface of the substrate, and recessing the polished second word line layer into the substrate to form the upper buried word line.

In example embodiments, a method of fabricating a semiconductor device having a buried word line structure may include forming a device isolation layer defining an active region in a semiconductor substrate, forming a trench for forming one or more recess channels in the active region, forming a gate insulating layer on a surface of the trench, forming a gate electrode layer on a surface of the gate insulating layer, and forming a buried word line burying the trench on a surface of the gate electrode layer.

In example embodiments, the method may include forming a capping layer on the gate electrode layer and/or the buried word line having a top surface that does not protrude beyond the surface of the substrate after forming the buried word line having the buried word line structure.

In example embodiments, forming of the buried word line may include forming a word line layer on the substrate so as to bury the trench, polishing the word line layer using chemical mechanical polishing (CMP) and an etch-back method which uses a dry etch to expose the surface of the substrate, and recessing the polished word line layer into the substrate.

In example embodiments, the gate electrode layer may be formed using a chemical vapor deposition (CVD) or an atomic layer deposition (ALD) method.

In example embodiments, the gate electrode layer may include polysilicon which may be formed using the atomic layer deposition method in which $Si_3H_8$ may be used as a silicon source gas.

In example embodiments, the buried word line may be formed using a chemical vapor deposition, a physical vapor deposition (PVD), or an atomic layer deposition (ALD) method.

In example embodiments, forming the buried word line may include forming a lower buried word line in a lower region of the gate electrode layer and forming an upper buried word line in an upper region of the gate electrode layer, the upper buried word line being formed of a material different from that of the lower buried word line.

In example embodiments, forming the lower buried word line may include forming a first word line layer on the substrate so as to bury the trench, polishing the first word line layer using chemical mechanical polishing and an etch-back method which uses a dry etch to expose the surface of the substrate, and recessing the polished first word line layer into the substrate to form the lower buried word line.

In example embodiments, forming the upper buried word line may include forming a second word line layer on the substrate so as to bury the trench in which the lower buried word line may be formed, polishing the second word line layer using chemical mechanical polishing to expose the surface of the substrate, and recessing the polished second word line layer into the substrate to form the upper buried word line.

In example embodiments, the trench may be formed to have a width within a range of about 10 to about 100 nm.

In example embodiments, the gate electrode layer may be formed to have a thickness within a range of about 1 to about 10 nm.

In example embodiments, the gate electrode layer may include polysilicon, and the buried word line may include any one selected from the group consisting of titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN), or a combination thereof.

In example embodiments, the gate electrode layer may include any one selected from the group consisting of titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN), or a combination thereof, and the buried word line may include any one selected from the group consisting of tungsten (W), aluminum (Al), cupper (Cu), molybdenum (Mo), titanium (Ti), tantalum (Ta), and ruthenium(Ru), or a combination thereof.

In example embodiments, the gate electrode layer may include any one selected from the group consisting of titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN), or a combination thereof.

In example embodiments, the lower buried word line may include polysilicon.

In example embodiments, the upper buried word line may include a silicide.

In example embodiments, the buried word line may include any one selected from the group consisting of tungsten (W), aluminum (Al), cupper (Cu), molybdenum (Mo), titanium (Ti), tantalum (Ta), and ruthenium (Ru), or a combination thereof.

In example embodiments, the gate insulating layer may be a thermal oxide layer formed by thermal oxidation.

BRIEF DESCRIPTION OF THE DRAWINGS

Example embodiments will be more clearly understood from the following detailed description taken in conjunction with the accompanying drawings. FIGS. 1-6 represent non-limiting, example embodiments as described herein.

FIG. 1 is a cross-sectional view of a semiconductor device having a gate structure according to the conventional art;

FIG. 2 is a graph illustrating gate voltage-current characteristics of the semiconductor device having a gate structure according to the conventional art;

FIG. 4 is a cross-sectional view of a semiconductor device having a gate structure according to example embodiments;

FIG. 5 is a graph illustrating gate voltage-current characteristics of a semiconductor device having the gate structure according to example embodiments; and FIG. 6 is a graph illustrating the time dependent dielectric breakdown (TDDB) of the gate insulating layer of the semiconductor device having the gate structure according to example embodiments.

DETAILED DESCRIPTION OF EXAMPLE EMBODIMENTS

Figure 1:
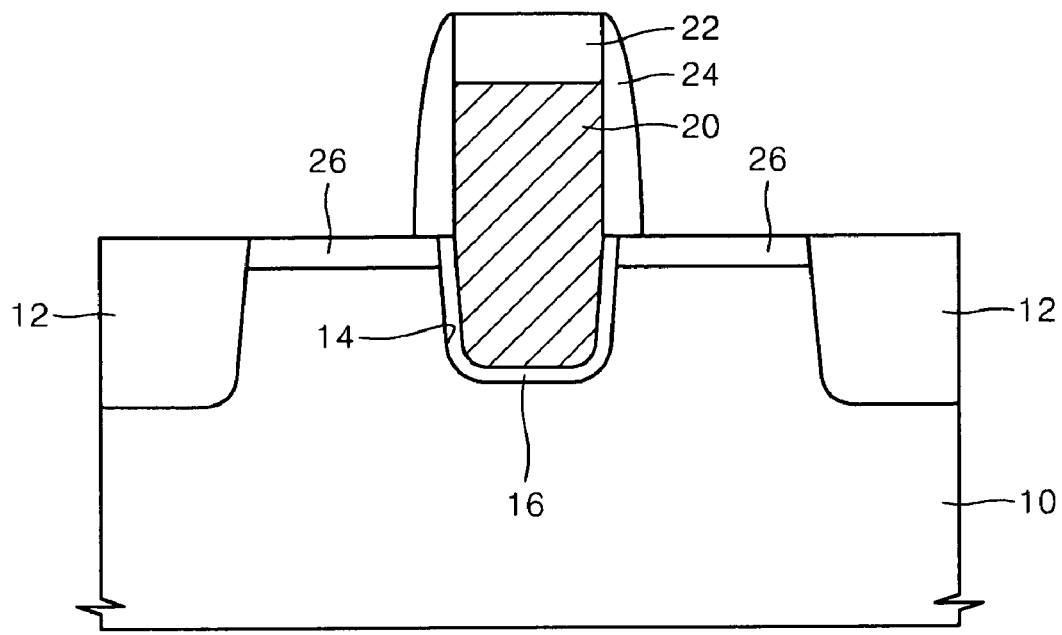
Figure 2:
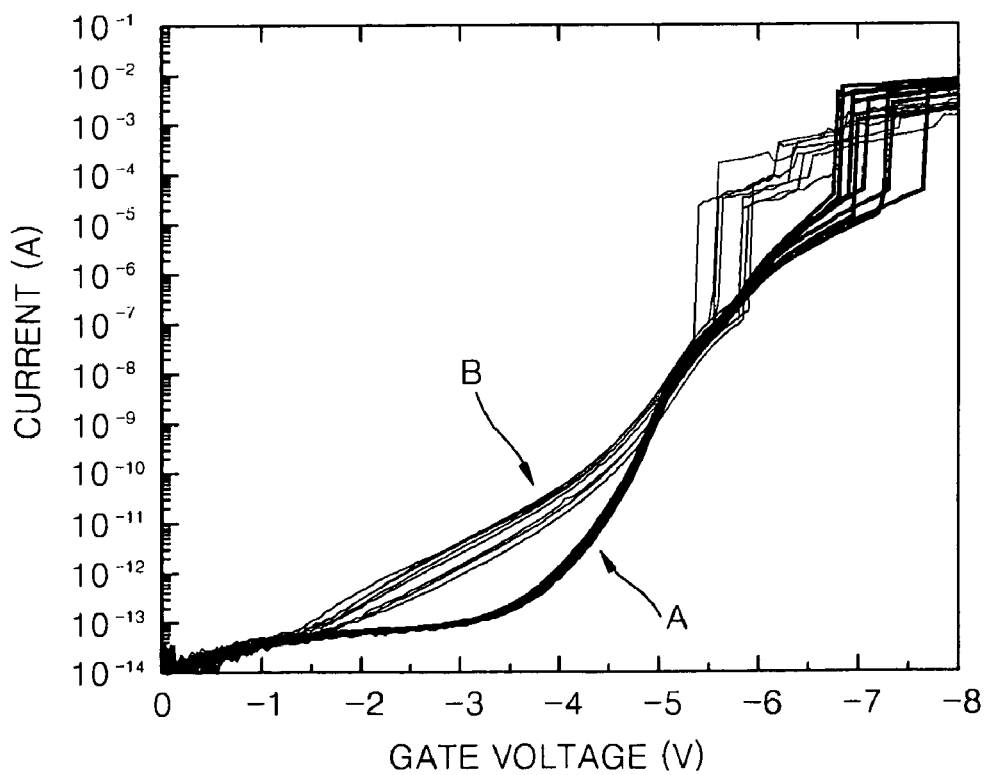

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 3A through 3E are cross-sectional views illustrating a method of fabricating a semiconductor device 100 having a gate structure according to example embodiments.

Figure 3A:
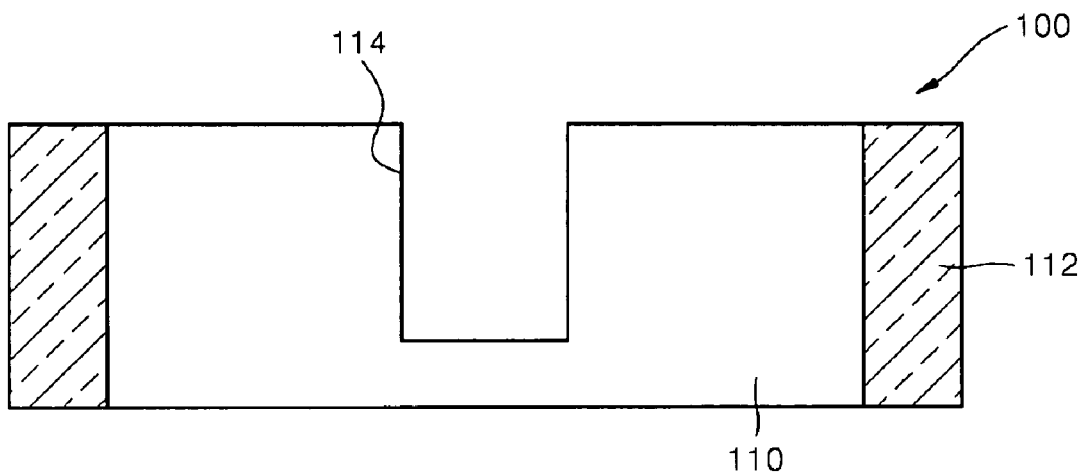
FIGS. 3A through 3E are cross-sectional views illustrating a method of fabricating a semiconductor device having a gate structure according to example embodiments.

Referring to FIG. 3A, a device isolation layer 112 defining an active region of a substrate 110 may be formed. The device isolation layer 112 may be a shallow trench isolation (STI) for improving the speed and the degree of integration of the device, but is not limited thereto.

A trench 114 forming a recess channel within the active region defined by the device isolation layer 112 may be formed. The trench 114 may be formed so as to have a width within a range of about 10 to about 100 nm, for example, below 50 nm.

One or more recess channels may be formed, and accordingly a plurality of trenches 114 may be formed within the active region defined by the device isolation layer 112. In order to form the trench 114, a buffer insulating layer (e.g., a silicon oxide layer) may be formed on the top surface of the substrate 110, and/or a hard mask layer (e.g., a polysilicon layer or a nitride layer) may be formed. Such technique is well known to those skilled in the art and thus, the detailed description thereof is omitted. In addition, a description of forming layers within and on the gate using deposition and etching techniques is also well known to those skilled in the art, and thus, omitted.

Figure 3B:
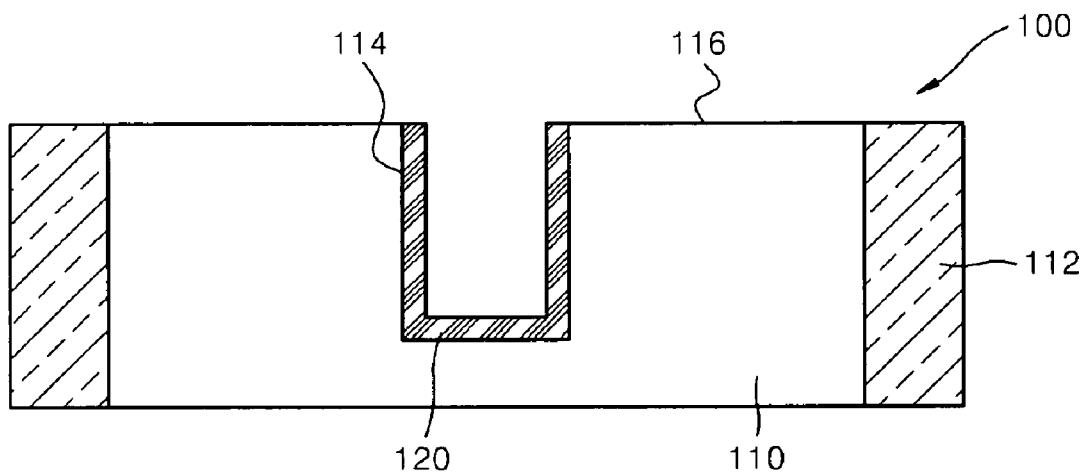

Referring to FIG. 3B, a gate insulating layer 120 may be formed on the bottom surface and the side surfaces of the trench 114. The gate insulating layer 120 may be a thermal oxide layer formed by thermal oxidation. The oxide layer formed on the top surface 116 of the substrate 110 when forming the gate insulating layer 120 may be removed using a conventional method (e.g., etching, and etc.), and thus, the detailed description thereof is omitted.

Figure 3C:
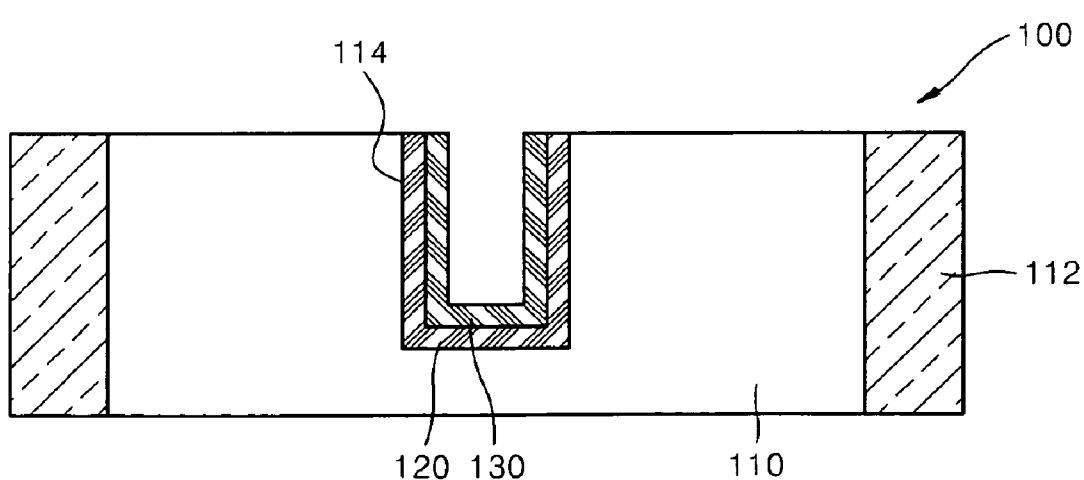

Referring to FIG. 3C, a gate electrode layer 130 may be formed on the surface of the gate insulating layer 120. The gate electrode layer 130 may be formed so as to have a thickness within a range of about 1 to about 10 nm, for example, below 5 nm. The gate electrode layer 130 may be formed using a chemical vapor deposition (CVD) or an atomic layer deposition (ALD) method. Materials used to form the gate electrode layer 130 will be described in detail below.

Figure 3D:
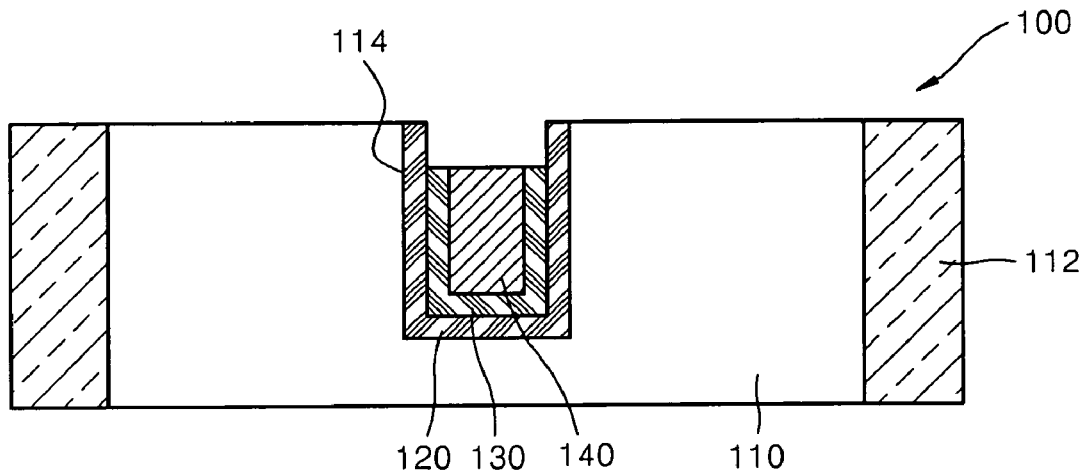

Referring to FIG. 3D, a word line layer 140 may be formed on the surface of the gate electrode layer 130 so as to bury the trench 114. The buried word line 140 may be formed using a chemical vapor deposition, a physical vapor deposition (PVD), or an atomic layer deposition method.

The top surfaces of the gate insulating layer 120, the gate electrode layer 130, and the buried word line 140 formed on the gate electrode layer 130 may be formed so as to not protrude beyond the top surface of the substrate 110, (e.g., so as to be completely buried within the substrate 110).

The buried word line 140 may be formed by forming a word line layer on the substrate 110 so as to bury the trench 114. The word line layer may then be polished using a chemical mechanical polishing (CMP) method and etched back using a dry etch process to expose the surface of the substrate 110. The buried word line 140 may be formed by recessing the polished word line layer into the substrate using a partial etch process. As illustrated, the gate electrode layer 130 may be recessed to the same level as the buried word line 140. However, this is merely illustrative and thus, the gate electrode layer 130 and the buried word line 140 are not limited to this recessed feature.

Figure 3E:
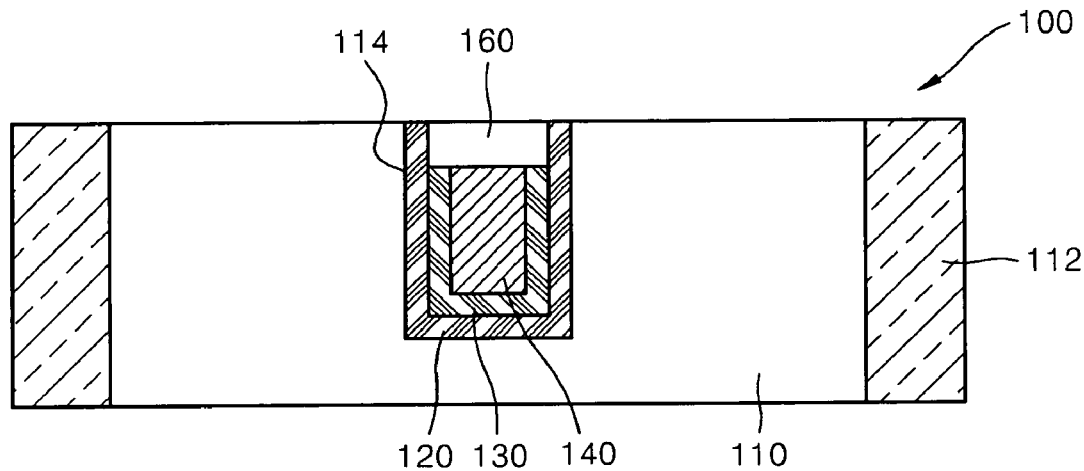

Referring to FIG. 3E, a capping layer 160 may optionally be formed on the gate electrode layer 130 and/or the buried word line 140, and may be formed such that the upper surface of the buried word line 140 does not protrude beyond the surface of the substrate 110, (e.g., to be completely buried within the substrate 110). FIG. 3E is merely illustrative and thus, the components thereof are not limited to the arrangement of the afore-mentioned description. Thus, the top surfaces of the gate electrode layer 130 and the gate insulating layer 120 may also be recessed within the substrate 110 and may be formed such that the capping layer 160 caps simultaneously the recessed regions of the gate insulating layer 120 and the gate electrode layer 130 and the recessed region of the buried word line 140. The size of the recessed region of the gate insulating layer 120, the gate electrode layer 130, and the buried word line 140 may be equal to or maybe different from each other. The capping layer 160 may be formed of an insulating material (e.g., a silicon oxide layer or a silicon nitride layer).

Materials used to form the gate electrode layer 130 and the buried word line 140 will now be described in detail below.

The gate electrode layer 130 may be formed of polysilicon. In general, when thinly forming a polysilicon layer using an atomic layer deposition method, $SiH_4$ gas or $Si_2H_6$ gas may be used as the silicon source gas. However, when the width of the trench is less than about 50 nm, there may be a constraint that the thickness of the polysilicon layer be no more than about 5 nm. When using the atomic layer deposition method using $SiH_4$ gas or $Si_2H_6$ gas, it may be more difficult to form a continuous layer having a thickness of about 5 nm. Therefore, in order to form the continuous polysilicon layer having a width of about 5 nm, $Si_3H_8$ gas may be used. Accordingly, when the gate electrode layer 130 includes polysilicon and is formed to a thickness of about 5 nm, the atomic layer deposition may be carried out using the $Si_3H_8$ gas.

When the gate electrode layer 130 is formed of polysilicon, the buried word line 140 may be formed of any one selected from the group consisting of titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN), or a combination thereof.

The gate electrode layer 130 may be formed of any one selected from the group consisting of titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN), or a combination thereof. In example embodiments, the buried word line 140 may be formed of any one selected from the group consisting of tungsten (W), aluminum (Al), cupper (Cu), molybdenum (Mo), titanium (Ti), tantalum (Ta), and ruthenium (Ru), or a combination thereof. However, this is merely illustrative, and thus, the gate electrode layer 130 and the buried word line 140 are not limited to these materials. Therefore, metals having a resistivity below 200 μΩcm may be used.

Figure 4:
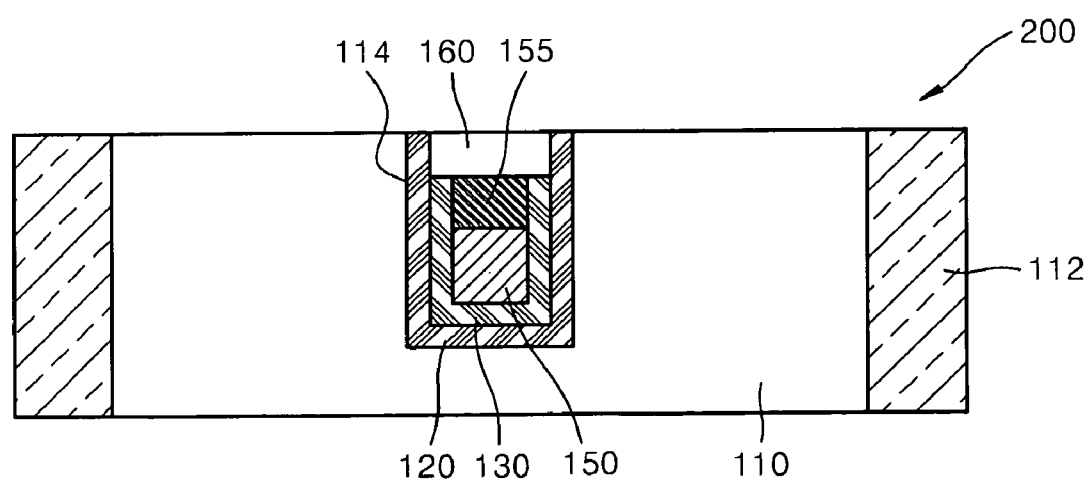

FIG. 4 is a cross-sectional view of a semiconductor device having a gate structure according to example embodiments. Hereinafter, the description overlapping with that described above will be omitted for the purpose of clarity.

Referring to FIG. 4, the buried word line 140 may include a lower buried word line 150 formed in the lower region of the gate electrode layer 130, and an upper buried word line 155 formed in the upper region of the gate electrode layer 130. The upper buried word line 155 may be formed of a different material from that of the lower buried word line 150.

The lower buried word line 150 may be formed by forming a first word line layer (not shown) on the substrate 110 so as to bury the trench 114. The first word line layer may then be polished using chemical mechanical polishing to expose the surface of the substrate 110. The lower buried word line 150 may be formed by recessing the polished first word line layer into the substrate 110.

The upper buried word line 155 may be formed by forming a second word line layer (not shown) on the substrate 110 so as to bury the trench 114 including the lower buried word line 150. The second word line layer may then be polished using chemical mechanical polishing to expose the surface of the substrate 110. The upper buried word line 155 may be formed by recessing the polished second word line layer into the substrate 110. Alternatively, the gate electrode layer 130 may be recessed together with the second word line layer.

The gate electrode layer 130 may be formed using a chemical vapor deposition (CVD) or an atomic layer deposition (ALD) method. The gate electrode layer 130 may be formed of any one selected from the group consisting of titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN), or a combination thereof.

The lower buried word line 150 may be formed using a chemical vapor deposition (CVD), a physical vapor deposition (PVD), or an atomic layer deposition (ALD) method. The lower buried word line 150 may be formed of polysilicon. When forming the lower buried word line 150 with polysilicon using the atomic layer deposition method, a gas of a silicon source including one selected from the group consisting of $SiH_4$ gas, $Si_2H_6$ gas, and $Si_3H_8$ gas, or a combination thereof may be used.

The upper buried word line 155 may be formed using a chemical vapor deposition (CVD), a physical vapor deposition (PVD), or an atomic layer deposition (ALD) method. The upper buried word line 155 may be formed of a silicide (e.g., $CoSi_x$ or $NiSi_x$). However, this is merely illustrative and thus, a silicide having a resistivity below about 200 μΩcm may be used.

The upper buried word line 155 may be formed of any one of tungsten (W), aluminum (Al), cupper (Cu), molybdenum (Mo), titanium (Ti), tantalum (Ta), and ruthenium (Ru), or a combination thereof. However, this is merely illustrative and thus, the upper buried word line 155 is not limited to these metals. As such, a metal having a resistivity below about 200 μΩcm may be used.

As described above, the electrical resistance of the word line of the buried word line 140 composed of the lower buried word line 150 and the upper buried word line 155 may be lower when the upper buried word line 155 includes silicide and metal material. In addition, the diffusion length may be shorter in comparison to the buried word line 140 being formed only of silicide. As such, control of the diffusion length may be more easily performed. Furthermore, because the lower buried word line 150 may be formed of polysilicon, a reduction of the aspect ratio is obtained. As such, the deposition of the metal that forms the upper buried word line 155 may be performed more easily.

Figure 5:
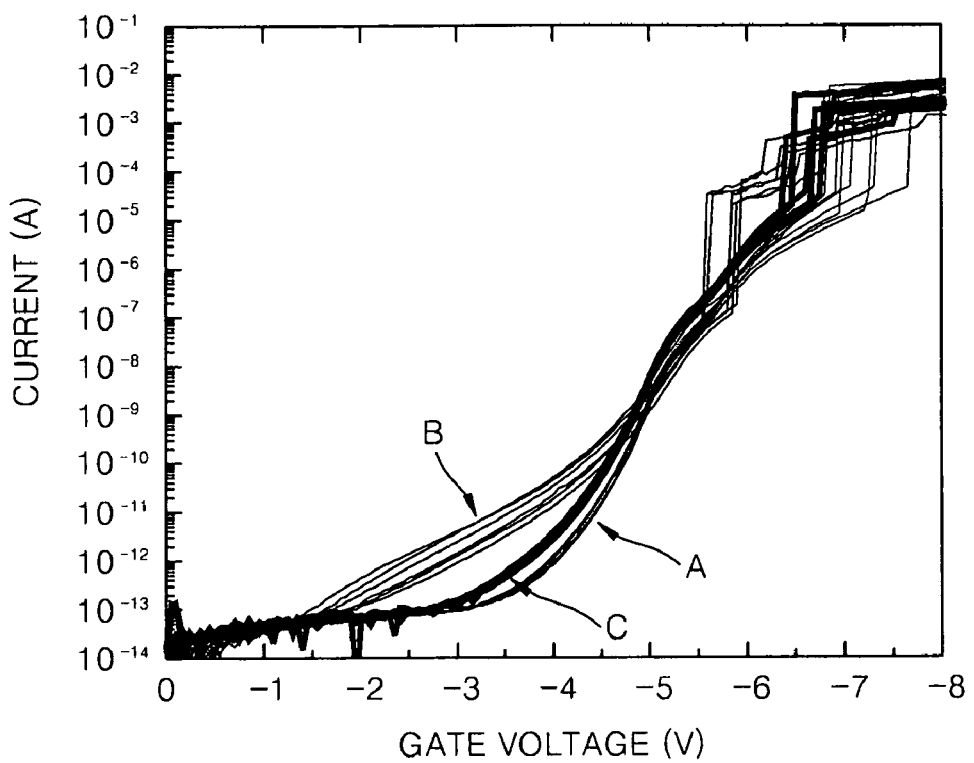

FIG. 5 is a graph illustrating gate voltage-current characteristics of a semiconductor device having the gate structure according to example embodiments.

Referring to FIG. 5, as described above with reference to FIG. 1, Line A illustrates gate voltage-current characteristics of a polysilicon gate electrode of the conventional art, and Line B illustrates gate voltage-current characteristics of a titanium nitride (TiN) gate electrode of the conventional art. Line C illustrates gate voltage-current characteristics of a device including a gate electrode layer formed of polysilicon having a thickness of about 4 nm and a buried word line formed of titanium nitride (TiN), according to example embodiments as described above with reference to FIGS. 3A-3E.

As described above in reference to the conventional art, when the gate electrode and the word line are formed of only titanium nitride (Tin), as indicated by line B, there may be a higher current value within a gate voltage range of approximately −3V to −5V than that when the gate electrode and the word line are formed of polysilicon, as indicated by Line A. As such, when the gate electrode and the word line are formed of only titanium nitride (Tin), there may be an increase in leakage current.

As illustrated by Line C, a device including a gate electrode layer formed of polysilicon having a thickness of about 4 nm and a buried word line formed of titanium nitride (TiN) according to example embodiments may have a current value within a gate voltage range of about −3V to −5V, which may be approximately equal to that when the gate electrode and the word line are formed of polysilicon, as indicated by Line A. As such, there may be less leakage current. This result may be related to the degradation of the reliability of the semiconductor device.

Figure 6:
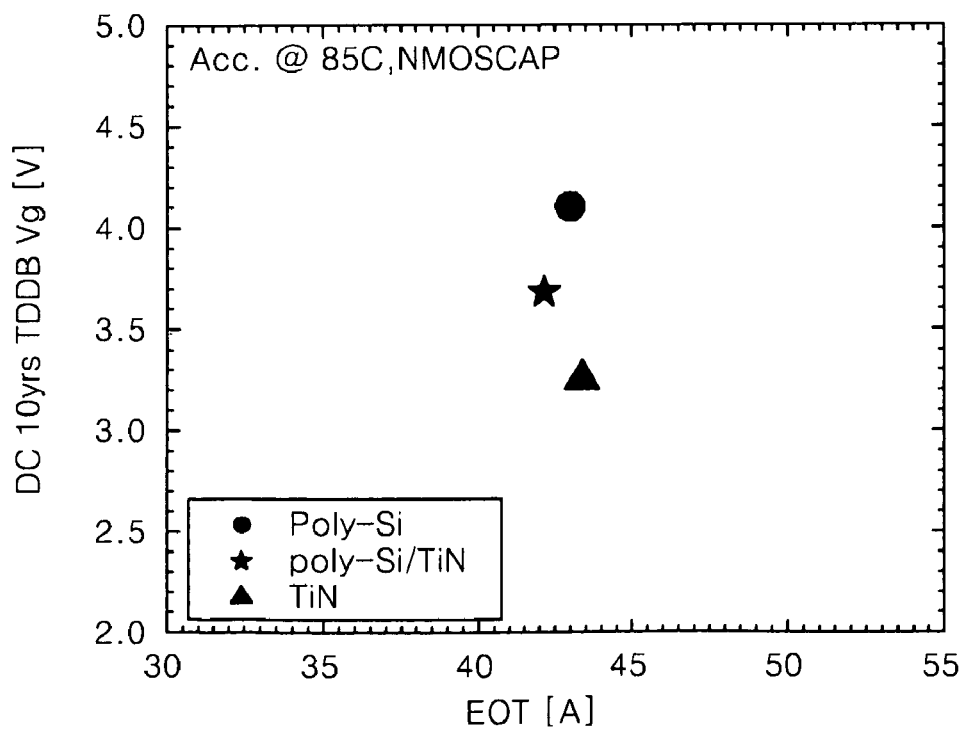

FIG. 6 is a graph illustrating the time dependent dielectric breakdown (TDDB) of the semiconductor device having a gate structure according to example embodiments.

Referring to FIG. 6, the gate voltage of the DC 10 years TDDB for a gate oxide layer having a thickness of approximately 4 nm may be approximately 4.1 V (the highest) when using the polysilicon gate electrode indicated by Line A of FIG. 5, and may be approximately 3.2 V (the lowest) when using the titanium nitride (TiN) gate electrode indicated by Line B of FIG. 5. According to example embodiments, the gate voltage, may be approximately 3.7 V when using the gate electrode and the word line formed of polysilicon and titanium nitride (TiN) having a thickness of approximately 4 nm. As a result, the reliability of the device may be improved in comparison to the case where the gate electrode and the word line are formed of only titanium nitride (TiN).

The semiconductor device having a buried word line structure of example embodiments may provide a lighter, thinner, shorter, and/or smaller semiconductor device by completely burying the gate electrode and the word line into the substrate, thereby reducing the height of the semiconductor device. In addition, in the semiconductor device according to example embodiments, the gate electrode may be formed of a different material from that of the word line. As such, the degradation of the oxide layer, which may be caused by the formation of the titanium nitride layer, may be reduced or prevented. Accordingly, the degradation and/or the deterioration of the semiconductor device may be reduced or prevented The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A semiconductor device having a buried word line structure, comprising:
   a trench including one or more recess channels in an active region defined by a device isolation region, the active region part of a semiconductor substrate;
   a gate insulating layer on a surface of the trench;
   a gate electrode layer on a surface of the gate insulating layer; and
   a buried word line burying the trench on a surface of the gate electrode layer, the buried word line including a lower buried word line in a lower region of the gate electrode layer, and an upper buried word line in an upper region of the gate electrode layer, a material of the upper buried word line different from a material of the lower buried word line.

2. The semiconductor device of claim 1, further comprising:
   a capping layer on at least one of the gate electrode layer and the buried word line, a top surface of the capping layer not protruding beyond a surface of the substrate.

3. The semiconductor device of claim 1, wherein the trench has a width within a range of about 10 to about 100 nm.

4. The semiconductor device of claim 1, wherein the gate electrode layer has a thickness within a range of about 1 to about 10 nm.

5. The semiconductor device of claim 1, wherein the gate electrode layer includes at least one of polysilicon, titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN).

6. The semiconductor device of claim 1, wherein the lower buried word line includes at least one of titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN).

7. The semiconductor device of claim 1, wherein the upper buried wordline includes at least one of titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN).

8. The semiconductor device of claim 1, wherein the lower buried word line includes polysilicon.

9. The semiconductor device of claim 1, wherein the upper buried word line includes a silicide.

10. The semiconductor device of claim 1, wherein the lower buried word line includes at least one of tungsten (W), aluminum (Al), cupper (Cu), molybdenum (Mo), titanium (Ti), tantalum (Ta), and ruthenium(Ru).

11. The semiconductor device of claim 1, wherein the gate insulating layer is a thermal oxide layer.

12. The semiconductor device of claim 1, wherein the upper buried word line includes at least one of tungsten (W), aluminum (Al), Copper (Cu), molybdenum (Mo), titanium (Ti), tantalum (Ta), and ruthenium (Ru).

* * * * *